(12) United States Patent
Hsieh et al.

(10) Patent No.: US 7,573,759 B2
(45) Date of Patent: Aug. 11, 2009

(54) METHOD FOR DETECTING DATA STROBE SIGNAL

(75) Inventors: Bo-Wei Hsieh, Taipei (TW); Ming-Shi Liou, Taipei (TW); Weber Chuang, Taipei (TW); Chi Chang, Taipei (TW)

(73) Assignee: Via Technologies, Inc., Taipei Hsien (TW)

( * ) Notice: Subject to any disclaimer, the term of this patent is extended or adjusted under 35 U.S.C. 154(b) by 0 days.

(21) Appl. No.: 11/528,639

(22) Filed: Sep. 28, 2006

(65) Prior Publication Data

US 2007/0036023 A1 Feb. 15, 2007

Related U.S. Application Data

(62) Division of application No. 11/074,730, filed on Mar. 9, 2005, now Pat. No. 7,257,035.

(30) Foreign Application Priority Data

Aug. 31, 2004 (TW) .............................. 93126240 A

(51) Int. Cl.
*G11C 7/00* (2006.01)

(52) U.S. Cl. .................... 365/193; 365/191; 365/189.07

(58) Field of Classification Search ................. 365/233, 365/191, 193, 233.5, 236, 189.07
See application file for complete search history.

(56) References Cited

U.S. PATENT DOCUMENTS

| 6,215,726 | B1 * | 4/2001 | Kubo ........................ 365/233 |
| 6,480,946 | B1 * | 11/2002 | Tomishima et al. ......... 711/167 |
| 6,898,682 | B2 * | 5/2005 | Welker et al. ............... 711/163 |
| 2004/0022311 | A1 * | 2/2004 | Zerbe et al. ................ 375/229 |

FOREIGN PATENT DOCUMENTS

| TW | 425555 | 3/2001 |
| TW | 455871 | 9/2001 |
| TW | 540051 | 7/2003 |

* cited by examiner

*Primary Examiner*—Hoai V Ho
*Assistant Examiner*—Kretelia Graham
(74) *Attorney, Agent, or Firm*—Rabin & Berdo, P.C.

(57) ABSTRACT

A method for detecting the data strobe signal from a Double Data Rate (DDR) Synchronous Dynamic Random Access Memory (SDRAM). The method executes a data reading process at first and records the latency period of the data read process to be a basis for detecting the arrival timing of the preamble in the data strobe signals in the subsequent data reading process.

11 Claims, 4 Drawing Sheets

METHOD FOR DETECTING DATA STROBE SIGNAL

RELATED APPLICATIONS

This is a Divisional of U.S. application Ser. No. 11/074,730, filed Mar. 9, 2005 now U.S. Pat. No. 7,257,035, and claims priority from Taiwan Application Serial Number 93126240, filed Aug. 31, 2004, the disclosure of which is hereby incorporated by reference herein in its entirety.

BACKGROUND

1. Field of Invention

The present invention relates to a method for detecting the data strobe signal (DQS) of a double data rate (DDR) synchronous dynamic random access memory (SDRAM). More particularly, the present invention relates to a method for detecting the data strobe signal when a DDR SDRAM is outputting the data.

2. Description of Related Art

In present data process systems, a SDRAM module is often used in memory unit. The SDRAM module is synchronous with the system, the data is accessed at rising edges of the system clock. Therefore, an SDRAM module can provide a higher data transmission rate than a memory module having an independent clock.

A new memory module, called a double data rate (DDR) SDRAM module is similar to conventional SDRAM modules, but the data is accessed at both rising edges and falling edges of the system clock. Therefore, the DDR SDRAM module can provide double data transmission rate batter than the conventional SDRAM module. However, some problems have appeared because of the endless promotion of the system clock rate.

FIG. 1 shows a timing diagram of data reading from a DDR SDRAM. CLK is the system clock. When a signal RC is enabled at low logic state with one clock cycle long as a reading command and then after passing through the latency 102, the data will be transmitted in the data lines DQ at the rate of two data per clock cycle for reading. Assuming that eight data (data D0-D7) can be read in a read operation. When the data is transmitted in the data lines DQ, a data strobe signal DQS, which is synchronous with the data lines DQ, is provided. Each rising edge and falling edge of the signal DQS indicates the one data arriving in the data line DQ. Signal DQS also provides a low logic state preamble 104 with one clock cycle to indicate data is arriving before transmitting the first data D0 in the data lines DQ; and a low logic state postamble 106 with a half clock cycle to indicate the end of the data in the data lines DQ. Other than the foregoing conditions, the signal DQS maintains in a high impedance (HI-Z) status (between the high logic state and the low logic state), the signal DQS is a tristate logic signal.

After the data and the data strobe signal DQS are outputted from the DDR SRAM, data in the data lines DQ is received next.

On the whole, when a read command signal RC is asserted, an input enable signal TNI is enabled by a receiving unit to receive the data lines DQ and the data strobe signal DQS after a few time. When a preamble 104 of the data strobe signal DQS is detected by the input enable signal TNI, a high logic state of the input enable signal TNI will be maintained until a postamble 106 of the data strobe signal DQS is detected. The data receiving unit can provide a data reading signal ZI, which is synchronous with the data strobe signal DQS, for controlling the data receiving operation during the enable time of the input enable signal TNI, wherein the data receiving unit will read the data in the data lines DQ at both rising edges and falling edges of the data reading signal ZI.

For a variety of reasons, such as the acceleration of clock frequency and different layouts of memory modules and circuit boards among all kinds of products, therefore the latency 102 is not the same (not a constant) for various products As a result, the appearance time of the preamble 104 of the data strobe signal DQS is also variable.

In the conventional method, when asserting a reading command signal RC, the input enable signal TNI detects the preamble of the data strobe signal DQS after a fixed time. If the latency 102 is larger than the fixed time, the input enable signal TNI will detect a high impedance part of the data strobe signal DQS, and then the data reading signal ZI will be unknown state. If the latency 102 is smaller than the fixed time, the input enable signal TNI will detect the data strobe signal DQS after the preamble, this will cause data reading lost.

SUMMARY

The present invention provides a method for detecting the arrival timing of a data signal in a DDR SDRAM module.

The data detecting method provided in the present invention can be applied in a DDR SDRAM module.

In accordance with the foregoing and other objectives of the present invention, a reading command is firstly asserted and then data is outputted for a memory unit formed by the DDR SDRAM modules. Next, starting counting at the same time when the reading command is asserted. Stopping counting and the storing the counting value when a first data is outputted from the memory unit. Finally, for the identical memory unit, using the stored counting value to predict the data arrival timing in the subsequent reading operations.

It is to be understood that both the foregoing general description and the following detailed description are by examples and are intended to provide further explanation of the invention as claimed.

BRIEF DESCRIPTION OF THE DRAWINGS

These and other features, aspects, and advantages of the present invention will become better understood with regard to the following description, of appended claims, and accompanying drawings where:

DESCRIPTION OF THE PREFERRED EMBODIMENTS

Figure 1:
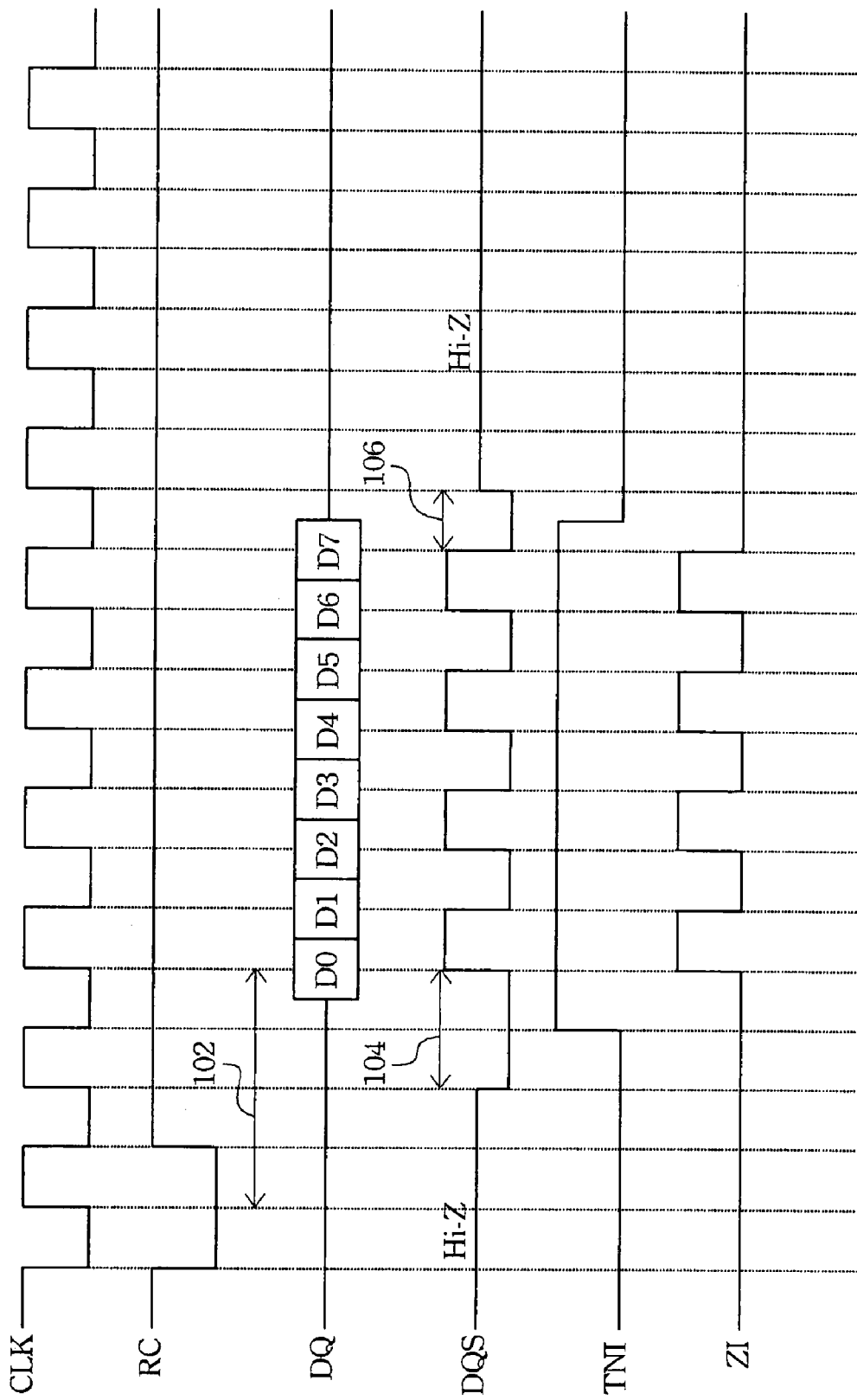
FIG. 1 shows a timing diagram of the prior art.

Reference will now be made in detail to the present preferred embodiments of the invention, examples of which are illustrated in the accompanying drawings. Wherever possible, the same reference numbers are used in the drawings and the description to refer to the same or like parts.

According to the foregoing description, it can be known that when a data receiving unit, such as central processing unit (CPU), executes a reading operation from a memory unit of DDR SDRAM modules, time of the data return from the memory unit and time of the data strobe signal may be asynchronous, which causes a difficulty of the data receiving unit to detecting data receiving timing.

Therefore, the embodiment according to the present invention, the data receiving timing is not a constant. Contrarily, data reading latency is counted and stored at first when the system operates. Then the arrival timing of the preamble of the data strobe signal can be predicted in accordance with the latency. After the data strobe signal is accurately detected, the data in the memory unit can be efficiently read.

Figure 2:
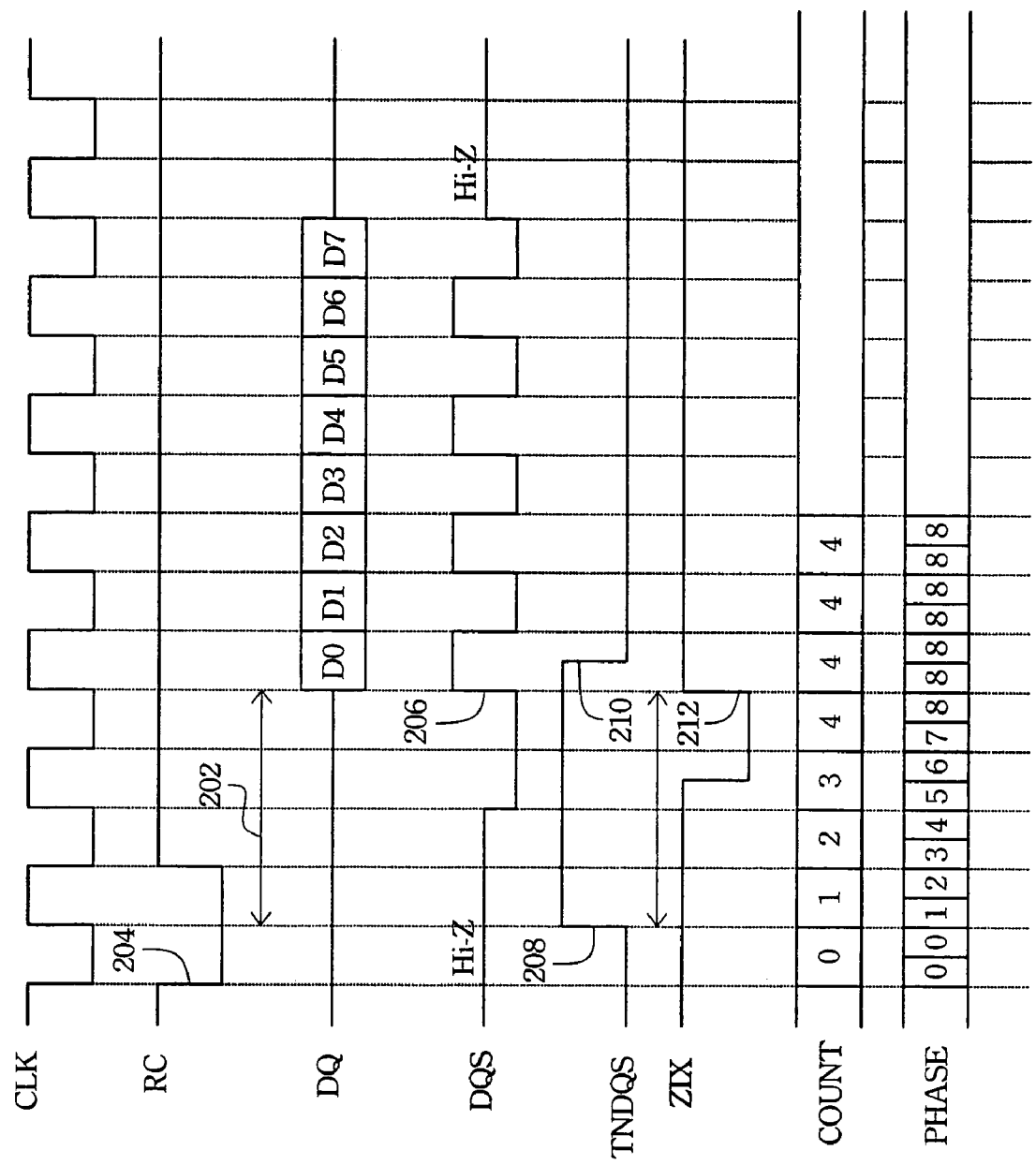
FIG. 2 shows a timing diagram of the present invention.

FIG. 2 illustrates an embodiment according to the present method. The purposes and the operations of a system clock CLK, a read command signal RC, data lines DQ and a data strobe DQS all are corresponding with the foregoing description. The present method is to obtain a latency 202 in data reading operation.

In this embodiment, a TNDQS signal is defined at first, which can be enabled at high logic state or at low logic state. It is assumed that the TNDQS signal is enabled at high logic state herein. When the reading command signal RC is asserted, driving a rising edge 208 of the TNDQS signal simultaneously. And then the first raising edge 206 of the DQS signal drives a falling edge 210 of the TNDQS signal. That is to say, the enable duration of the TNDQS signal is as similar as the latency 202. Furthermore, a ZIX signal is defined due to a delay between the falling edge 210 of the TNDQS signal and the first rising edge 206 of the DQS signal.

Similarly, the ZIX signal can be enabled at a high logic state or at a low logic state. It is assumed that the ZIX signal is enabled at a low logic state herein. When the TNDQS signal is at low logic state (e.g. disable state), the ZIX signal is at high logic state (e.g. disable state). When the TNDQS signal is at high logic state (e.g. enable state), the ZIX signal is synchronous with the data strobe signal DQS. Otherwise, the high impedance state of the DQS signal causes the ZIX signal to be transited at high logic state (e.g. disable state). This transition can be implemented by a voltage comparative method which is popularly known by those skilled in the art. For example, a reference voltage, which voltage value is between the low logic state and the high impedance level, can be used to compare with the voltage of the DQS signal. Because the voltage of the DQS signal is higher than the reference voltage, thus a high logic state voltage is outputted and causes the ZIX signal to be transited at high logic state (e.g. disable state).

Thus it can be seen from FIG. 2, rising edge 212 of the ZIX signal almost synchronizes with the first rising edge 206 of the DQS signal. As a result, the duration between the rising edge 208 of the TNDQS signal and the rising edge 212 of the ZIX signal is identical with the latency 202 of data reading. Therefore, rising edge 208 of the TNDQS signal counts a counter register COUNT, which initial value is zero, and a counter register PHASE; and then rising edge 212 of the ZIX signal stops them. The counting value is then respectively latched in the accordingly to the counter register COUNT and PHASE.

The counter register PHASE can provide higher timing resolution than counter register COUNT, because the counting rate of the counter register PHASE is four times of the system clock CLK, however, the counting rate of the counter register COUNT is two times of CLK. In practice, the counting rate can be designed according to the requirements and is not limited by the embodiment.

According to the counting value stored in counter register COUNT or PHASE, the input enable signal TNI shown in FIG. 1 can detect preamble of subsequent reading data.

For example, when the data receiving unit issues a reading command signal, a reference counter register identical with the count register COUNT is simultaneously counted. If the counting value counted by the reference counter register is same as the counting value latched in the counter register COUNT, the input enable signal TNI is enabled for reading the data lines DQ and the data strobe signal DQS.

Otherwise, when the data receiving unit issues a reading command signal, another reference count register identical with the count register PHASE is counted. If the counting value counted by the reference counter register is same as the counting value latched in the counter register PHASE, the input enable signal TNI is enabled for reading the data lines DQ and the data strobe signal DQS. Obviously, a higher timing resolution is provided in this example.

Figure 3:
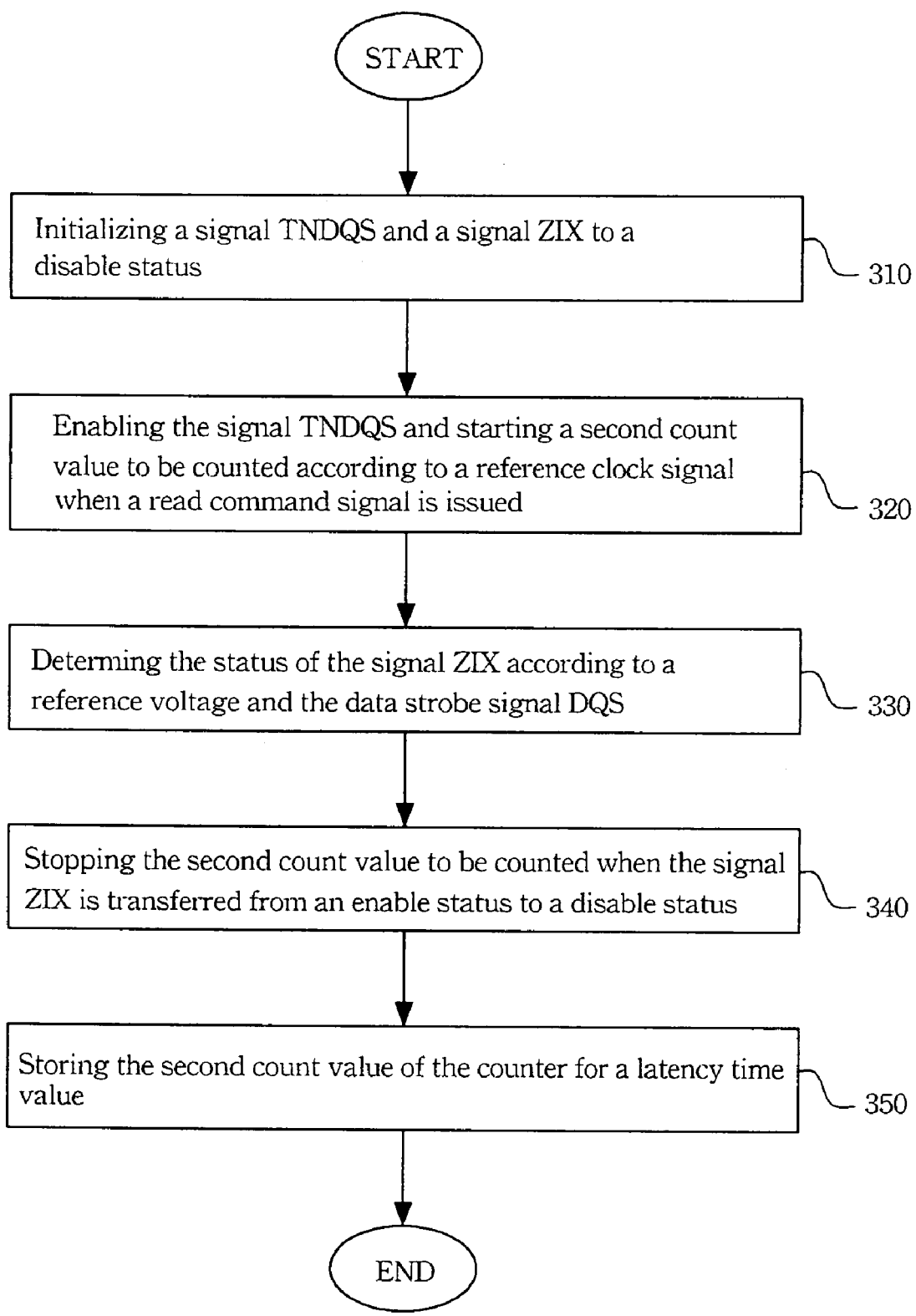
FIG. 3 shows a flow chart of a method for counting latency in accordance with an embodiment of the present invention.

FIG. 3 shows a flow chart of the method for evaluating latency in accordance with the present invention. In step 310, respectively initialing both signal TNDQS and ZIX to its own initial state. In step 320, enabling the signal TNDQS (high logic state) and counting a counter when a reading command is asserted. In step 330, determining the logic state of the ZIX signal by comparing the voltage level of data strobe signal DQS with a reference voltage. If the voltage level of DQS is higher than the reference voltage, the ZIX signal is regarded as being in the disable state (high logic state); on the contrary, the ZIX signal is regarded as being in the enable state (low logic state). In step 340, stopping counting when the ZIX signal transits to the disable state from the enable state. In step 350, storing a counting value counted by the counter, wherein the counting value is regarded as the latency.

Figure 4:
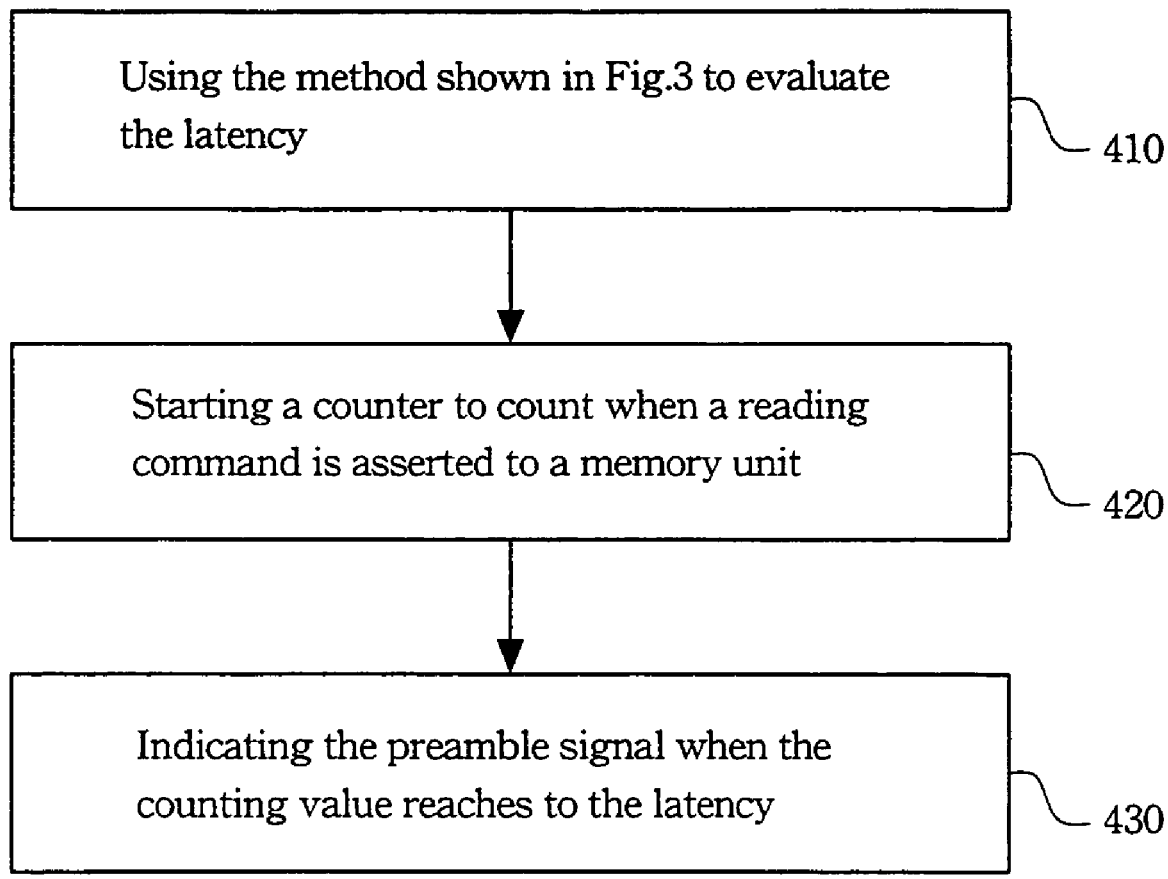
FIG. 4 shows a flow chart of a method for detecting preamble of a data strobe signal in accordance with an embodiment of the present invention.

FIG. 4 shows a flow chart of the method for detecting preamble of data strobe signal DQS in accordance with the present invention. In step 410 using the foregoing method to evaluate the latency. In step 420, a counter starts to count when a reading command (ex. reading command signal RC as shown in FIG. 1 and FIG. 2) is asserted to a memory unit. In step 430, indicating the preamble by asserting a TNI signal when the counting value reaches to the latency.

The present method can be implemented in any time, for example when the system is initializing or when the system is operating, to usually update the latency and make sure the most reading efficiency is obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for estimating latency comprising:
   enabling a first signal when a reading command signal is asserted to read data;
   disabling a second signal when said data starts to be accessed, wherein said second signal is disabled synchronously with a first rising edge of a data strobe signal; and
   counting a period time during the enabling of said first signal and the disabling of said second signal to obtain said latency,
   wherein the latency period has an end, the second signal ends substantially at the same time as the end of the latency period, and the first signal ends after the second signal ends.

2. The method of claim 1, wherein said second signal has states that are determined by the data strobe signal when said first signal is at an enable state.

3. The method of claim 1, wherein said second signal is at a disable state when a logic state of the data strobe signal is higher than a reference voltage.

4. The method of claim 3, wherein said second signal is at an enable state when a logic state of a data strobe signal is lower than said reference voltage.

5. The method of claim 4, wherein said reference voltage is between high impedance states and a low logic state of the data strobe signal.

6. The method of claim 1, wherein said first signal is disabled at a low logic state and enabled at a high logic state.

7. The method of claim 1, wherein said second signal is disabled at a high logic state and enabled at a low logic state.

8. A method for estimating latency comprising:
    enabling a first signal when a reading command signal is asserted to read data;
    disabling a second signal when said data starts to be accessed, wherein said second signal is disabled synchronously with a first rising edge of a data strobe signal; and
    counting a period time during the enabling of said first signal and the disabling of said second signal to obtain said latency,
    wherein the reading command is a pulse having the duration of one clock cycle, and the latency period begins at the middle of the pulse.

9. A method for estimating latency comprising:
    enabling a first signal when a reading command signal is asserted to read data;
    disabling a second signal when said data starts to be accessed, wherein said second signal is disabled synchronously with a first rising edge of a data strobe signal; and
    counting a period time during the enabling of said first signal and the disabling of said second signal to obtain said latency,
    wherein the second signal has a duration that is shorter than half of the duration of the first signal.

10. The method of claim 1, wherein the second signal is a pulse having a beginning and an end, and bits are read sequentially from a memory starting at the end of the pulse.

11. The method of claim 1, wherein the second signal has a duration that is shorter than the duration of the data strobe signal.

* * * * *